(12) United States Patent
Nieuwenhuizen

(10) Patent No.: US 11,815,068 B2
(45) Date of Patent: Nov. 14, 2023

(54) ELECTRICAL RESONANCE CHANGE IN A WIND TURBINE

(71) Applicant: Siemens Gamesa Renewable Energy A/S, Brande (DK)

(72) Inventor: John Nieuwenhuizen, Horsens (DK)

(73) Assignee: SIEMENS GAMESA RENEWABLE ENERGY A/S, Brande (DK)

( * ) Notice: Subject to any disclaimer, the term of this patent is extended or adjusted under 35 U.S.C. 154(b) by 495 days.

(21) Appl. No.: 17/255,582

(22) PCT Filed: Jun. 24, 2019

(86) PCT No.: PCT/EP2019/066698
§ 371 (c)(1),
(2) Date: Dec. 23, 2020

(87) PCT Pub. No.: WO2020/007635
PCT Pub. Date: Jan. 9, 2020

(65) Prior Publication Data
US 2021/0164448 A1  Jun. 3, 2021

(30) Foreign Application Priority Data

Jul. 3, 2018  (EP) .................................... 18181459

(51) Int. Cl.
| | |
|---|---|
| *F03D 13/20* | (2016.01) |
| *F03D 80/70* | (2016.01) |
| *H05K 9/00* | (2006.01) |
| *F03D 9/25* | (2016.01) |
| *F03D 1/06* | (2006.01) |

(52) U.S. Cl.
CPC ............ *F03D 80/70* (2016.05); *F03D 13/20* (2016.05); *H05K 9/0001* (2013.01); *H05K 9/0073* (2013.01); *F03D 1/0675* (2013.01); *F03D 9/25* (2016.05); *F05B 2240/14* (2013.01); *F05B 2240/50* (2013.01); *F05B 2240/912* (2013.01)

(58) Field of Classification Search
CPC .............................. F03D 13/20; H05K 9/0073
See application file for complete search history.

(56) References Cited

U.S. PATENT DOCUMENTS

| | | | | |
|---|---|---|---|---|
| 2009/0142178 A1* | 6/2009 | Nieuwenhuizen | ...... | F03D 13/22 415/2.1 |
| 2013/0280064 A1* | 10/2013 | van Steinvoren | ....... | F03D 13/35 416/1 |

FOREIGN PATENT DOCUMENTS

| | | |
|---|---|---|
| EP | 2 378 850 A1 | 10/2011 |
| JP | 2017 078590 A | 4/2017 |
| WO | WO2008/006377 A1 | 1/2008 |
| WO | WO 2008/092464 A2 | 8/2008 |

OTHER PUBLICATIONS

PCT International Search Report and Written Opinion dated Oct. 14, 2019 corresponding to PCT International Application No. PCT/EP2019/066698.

* cited by examiner

*Primary Examiner* — Sherman Ng
(74) *Attorney, Agent, or Firm* — Schmeiser, Olsen & Watts LLP

(57) ABSTRACT

A wind turbine including a plurality of elements including a tower, a nacelle mounted to the tower and a plurality of blades rotatable mounted to the nacelle is provided. At least one element of the tower, the nacelle and the blades includes a coaxial impedance member coaxially arranged about an axis of the element.

11 Claims, 4 Drawing Sheets

ELECTRICAL RESONANCE CHANGE IN A WIND TURBINE

CROSS-REFERENCE TO RELATED APPLICATIONS

This application claims priority to PCT Application No. PCT/EP2019/066698, having a filing date of Jun. 24, 2019, which is based on EP Application No. 18181459.1, having a filing date of Jul. 3, 2018, the entire contents both of which are hereby incorporated by reference.

FIELD OF TECHNOLOGY

The following relates to the field of wind turbines. A conventional wind turbine comprises a plurality of elements including a tower, a nacelle mounted to the tower and a plurality of blades rotatable mounted to the nacelle.

BACKGROUND

Such a conventional wind turbine has an electric resonance frequency which is normally fixed due to the size of the enclosure. Radiated radio frequencies depend on how good the wind turbine emits the RF energy generated mainly by the energy conversion components. Limits are set in international standards such as in the requirements for radiated emissions for wind turbines. Here, some newly defined limit requirements are defined down to a frequency of about 150 kHz. However, wind turbines have a size corresponding to a few hundred kHz and are included in a range set by the recent standards.

Usually, emissions are reduced by implementing filters and by carefully using EMC workmanship like shielding. However, due to the requirements for radiated emissions, it becomes very difficult and expensive to satisfy these limits as even a low current of some mA running in the surface of the wind turbine would exceed the limits. Normally, the dimension of the element, i.e. the dimension of the enclosure of the element defines the antenna characteristics of the element, but this dimension cannot readily be changed.

There may be a need for a wind turbine which satisfies the EMC standards under low costs without burdensome redesigns of the wind turbine.

SUMMARY

According to a first aspect of embodiments of the invention, a wind turbine comprises a plurality of elements including a tower, a nacelle mounted to the tower and a plurality of blades rotatable mounted to the nacelle, wherein at least one element of the tower, the nacelle and the blades comprises a coaxial impedance member coaxially arranged about an axis of the element. The axis of the element can be the longitudinal axis thereof, which is the axis of the longest extension. The element is configured to exhibit electromagnetic oscillation along the axis with a resonance frequency of an order n, wherein the coaxial impedance member is tuned to the resonance frequency of the order n.

Advantageously, the coaxial impedance member can function as a choke such that an electric current oscillating with the resonance frequency within the element is attenuated and the energy thereof is converted to heat in the coaxial impedance member. In addition or alternatively, the coaxial impedance member can function as a detuning member such that the resonance frequency is split in two resulting resonance frequencies being higher than the resonance frequency. With it, the EMC standards can readily be satisfied under low costs.

The coaxial impedance member is configured to be placed at different positions along the axis of the element so that the choking and detuning effects can be optimized.

The coaxial impedance member has a length substantially equal to approximately one-quarter wavelength of the resonance frequency. In particular, the coaxial impedance member can thus be tuned to the first order resonance frequency which is thereby well absorbed.

The coaxial impedance member is formed of a tape or a sleeve comprising electrically conductive material. More preferred, the electrically conductive material comprises a nanocrystalline or ferrite material. The coaxial impedance member allows detuning the resonance frequency in a simple and cost effective manner. Due to the very low common mode current in the tower surface, only a very small amount of tape material is needed. The arrangement of such a coaxial impedance member can readily be integrated in the manufacturing process of the tower or the other elements of the wind turbine, and it is even possible to retrofit existing wind turbines by adding the coaxial impedance member.

In a second aspect of embodiments of the present invention, a tower for a wind turbine comprises a coaxial impedance member coaxially arranged about a longitudinal axis of the tower.

In a third aspect of embodiments of the present invention, a blade for a wind turbine comprises a coaxial impedance member coaxially arranged about a longitudinal axis of the blade.

In a fourth aspect of embodiments of the present invention, a method of suppressing electromagnetic radiation having a resonance frequency of an order n in a wind turbine comprising a plurality of elements including a tower, a nacelle mounted to the tower and a plurality of blades rotatable mounted to the nacelle, the method comprises a step of arranging a coaxial impedance member coaxially about an axis of at least one element of the tower, the nacelle and the blades.

The step of arranging the coaxial impedance member comprises a step of placing the coaxial impedance member at a position along the axis of the at least one element, where a current distribution or current density in the element exhibits a maximum.

Arranging the coaxial impedance member comprises a step of wrapping a tape of an electrically conductive material about the at least one element.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this application.

BRIEF DESCRIPTION

Some of the embodiments will be described in detail, with reference to the following figures, wherein like designations denote like members, wherein.

DETAILED DESCRIPTION

Figure 1:
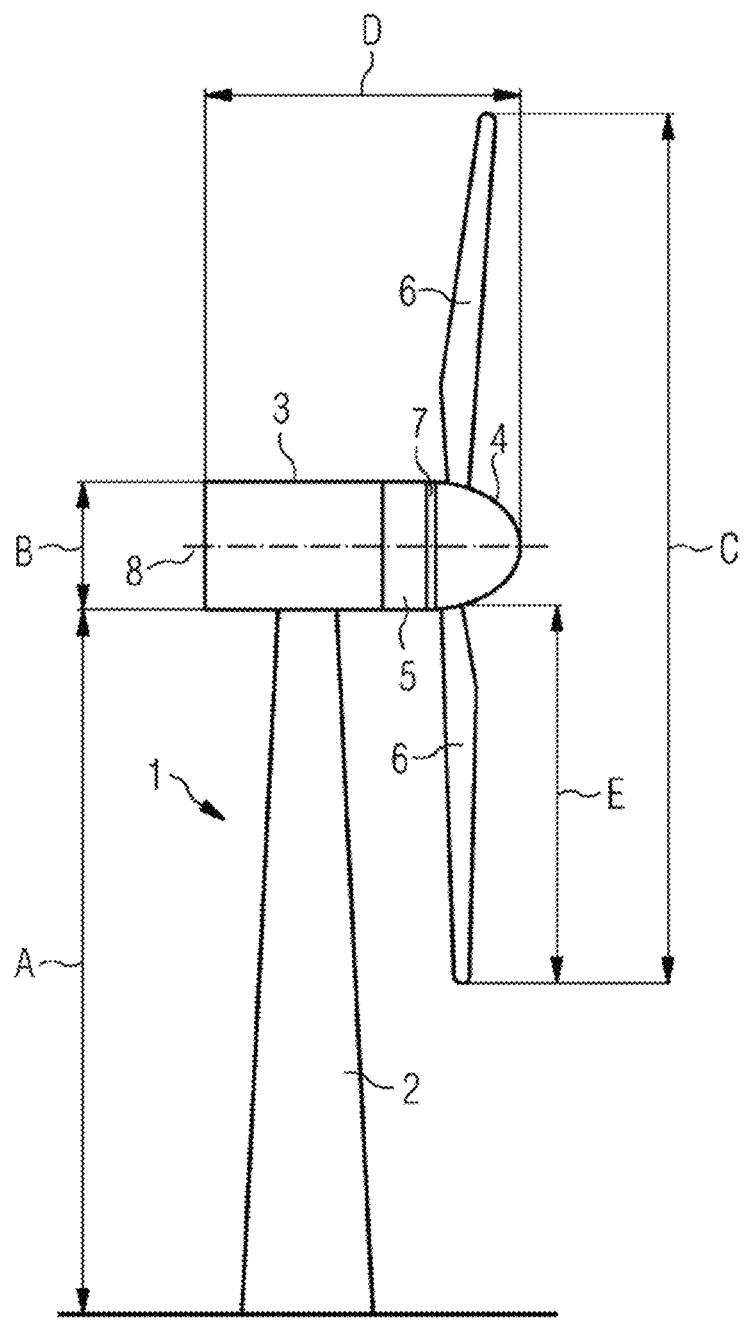
FIG. 1 shows a wind turbine and the different elements thereof.

FIG. 1 shows a wind turbine 1. The wind turbine 1 comprises a nacelle 3 and a tower 2. The nacelle 3 is mounted at the top of the tower 2. The nacelle 3 is mounted rotatable with regard to the tower 2 by a yaw bearing. The axis of rotation of the nacelle 3 with regard to the tower 2 is referred to as the yaw axis.

The wind turbine 1 also comprises a hub 4 with three rotor blades 6 (of which two rotor blades 6 are depicted in FIG. 1). The hub 4 is mounted rotatable with regard to the nacelle 3 by a main bearing 7. The hub 4 is mounted rotatable about a rotor axis of rotation 8.

The wind turbine 1 furthermore comprises a generator 5. The generator 5 in turn comprises a rotor 10 connecting the generator 5 with the hub 4. The hub 4 is connected directly to the generator 5, thus the wind turbine 1 is referred to as a gearless, direct-driven wind turbine. Such a generator 5 is referred as direct drive generator 5. As an alternative, the hub 4 may also be connected to the generator 5 via a gear box. This type of wind turbine 1 is referred to as a geared wind turbine. Embodiments of the present invention are suitable for both types of wind turbines 1.

The generator 5 is accommodated within the nacelle 3. The generator 5 is arranged and prepared for converting the rotational energy from the hub 4 into electrical energy in the shape of an AC power. Thereby, the generator 5 generates noise in the shape of RF radiation.

Each element of the wind turbine 1 has a certain dimension. The tower 2 has a height A. The blades 6 form together a diameter C, and each blade 6 has a length E. The nacelle 3 has a height B and a length D.

Figure 2:
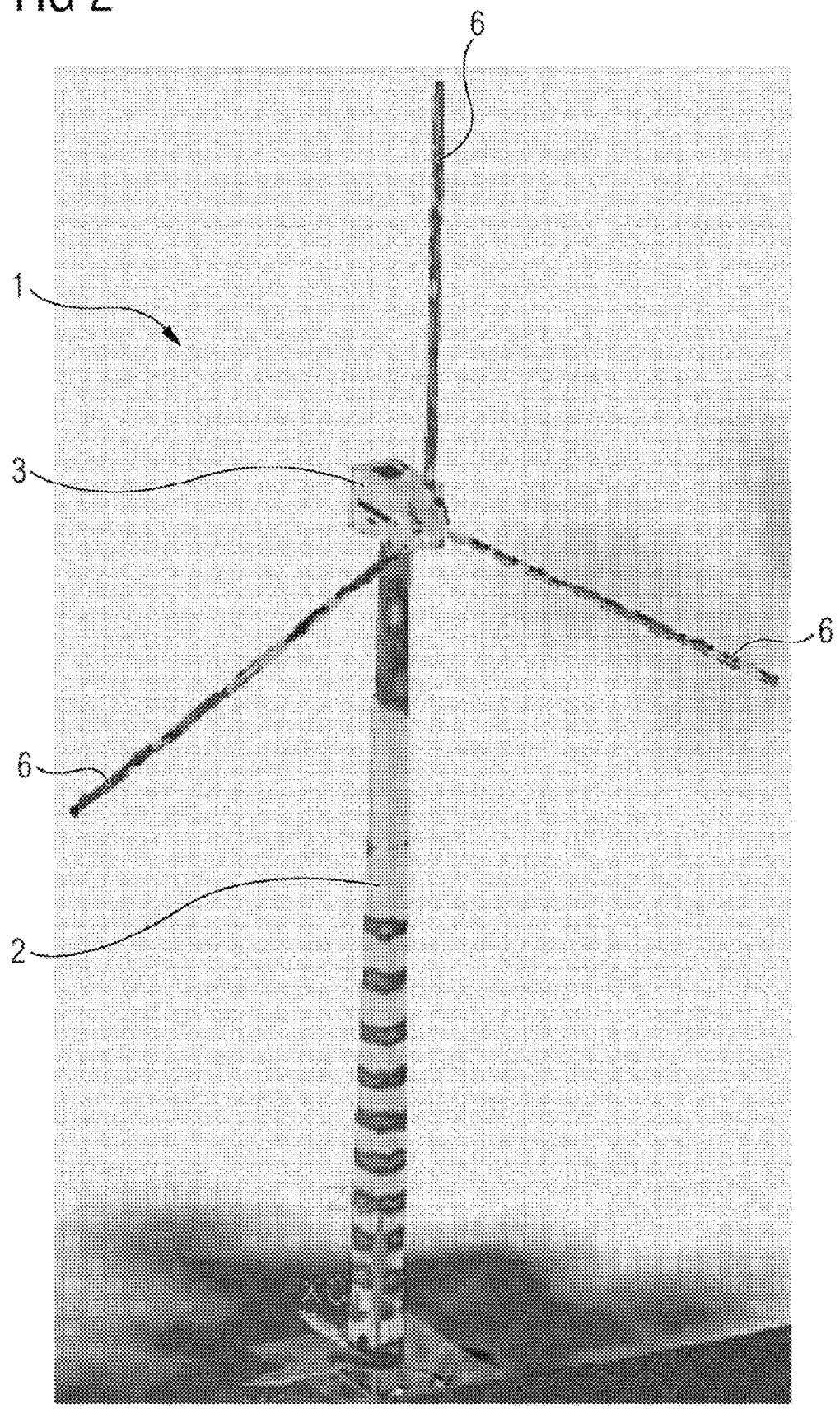
FIG. 2 shows a distribution of an electric RF-current in a wind turbine.

The wind turbine 1, especially the tower 2 thereof, is a large conductive structure for RF-energy. The wind turbine 1 can be considered as an antenna (particularly a monopole antenna). The physical dimension of length determines the electromagnetic resonance frequency. For each dimension A, B, C, D and E, a specific resonance frequency $f_n$ of an order n is present. Also each combination of any elements exhibits a specific resonance frequency $f_n$ of an order n. FIG. 2 shows an example of a distribution of an electric RF-current in the wind turbine 1.

Figure 3:
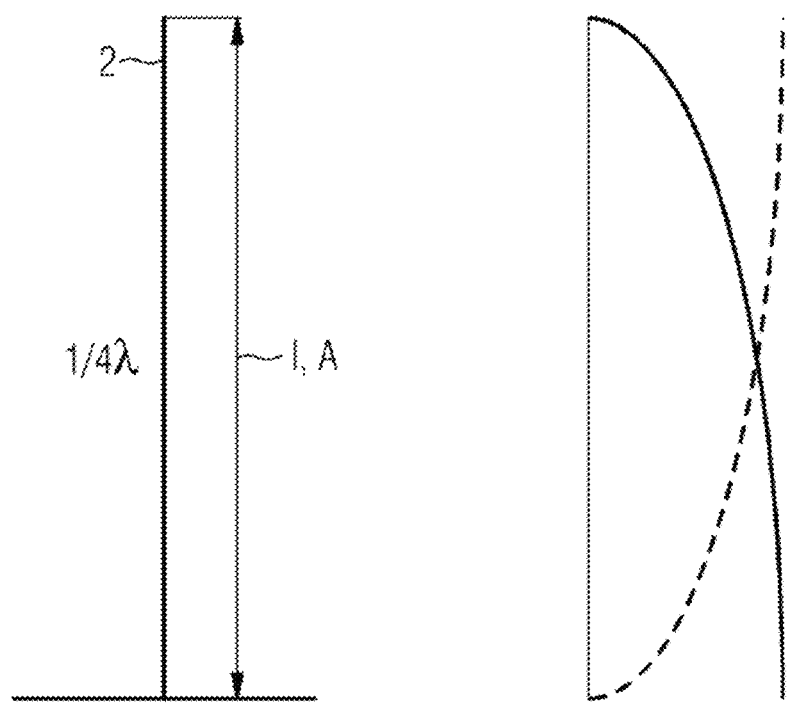
FIG. 3 shows electromagnetic oscillation with a first order resonance frequency $f_1$ along the axis of the tower.

For the first order harmonics (n=1), the quarter wavelength $\frac{1}{4}\lambda_1$ is the most effective length for an antenna, where resonance can be used for transmitting or receiving radio signals. FIG. 3 shows a first order harmonics within the tower 2 along the longitudinal axis of the tower 2. The length 1 of the element corresponds to $\frac{1}{4}\lambda_1$ of the resonance frequency $f_1$ of the first order harmonics (n=1).

According to embodiments of the present invention, a coaxial impedance member 10 is coaxially arranged about a longitudinal axis of the tower 2 and axially aligned with the tower 2. The term "coaxially arranged about a longitudinal axis" includes a case where the coaxial impedance member 10 is arranged coaxially to and radially outside of the tower 2, and a case where the coaxial impedance member 10 is arranged coaxially to and embedded in the tower 2. The term "longitudinal axis" normally refers to the axis of the longest extension of the tower 2, i.e. in the upright direction of the tower 2. The coaxial impedance member 10 can be arranged onto a circumferential surface of the tower 2.

The same applies to embodiments where the coaxial impedance member 10 is arranged at another element such as the nacelle 3 and the blades 6. With regard to the nacelle 3 as shown in FIG. 1, one coaxial impedance member 10 can be coaxially arranged about the vertical axis, and another coaxial impedance member 10 can be arranged about the horizontal axis, i.e. the rotational axis 8.

The coaxial impedance member 10 has an inductance. The impedance member is tuned to the resonance frequency $f_1$ of the order 1. The coaxial impedance member 10 may have a length which is substantially equal to approximately one-quarter wavelength $\lambda_1$ ($\frac{1}{4}\lambda_1$) of the resonance frequency $f_1$ of the first order harmonics (n=1). By arranging the coaxial impedance member 10, two advantageous effects are obtained:

First, the coaxial impedance member 10 acts like choke so that the resonance frequency $f_1$ is choked. That means, the RF-current in the tower 2 is attenuated and converted to heat in the coaxial impedance member 10. The energy of the resonance frequency $f_1$ of the order n=1 is absorbed by the impedance member 10. The coaxial impedance member 10 is placed to a position, where a current distribution in the tower 2 exhibits a maximum so that a large amount of energy is absorbed.

Figure 4:
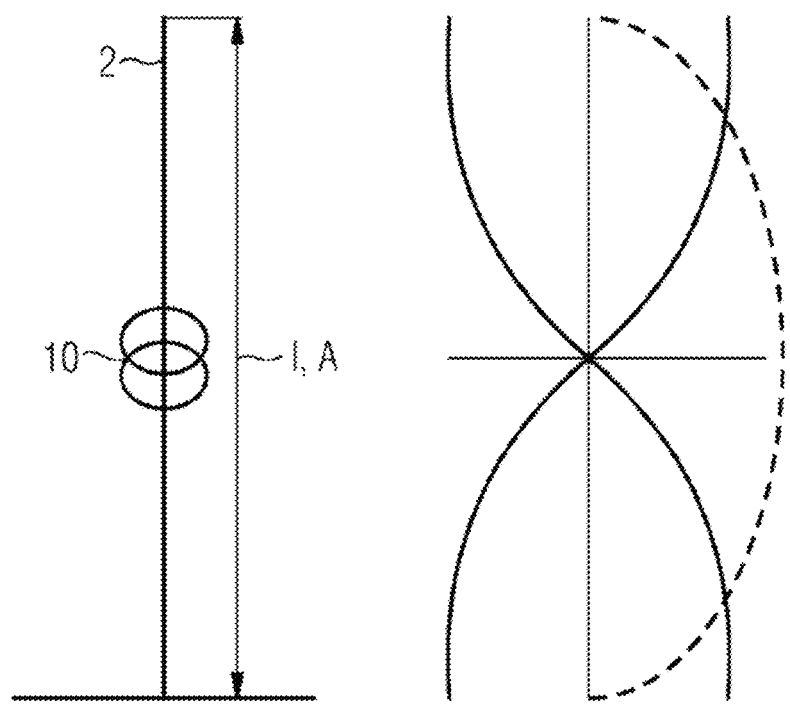
FIG. 4 shows electromagnetic oscillation with resulting resonance frequencies along the axis of the tower equipped with a coaxial impedance member.

Second, the resonance frequency $f_1$ of the order 1 is detuned. FIG. 4 shows that the physical length 1 (corresponding to the length A in FIG. 1) of the tower 2 is split in two parts by the coaxial impedance member 10. The resulting resonance frequencies are higher than the original resonance frequency. For example, if the coaxial impedance member 10 is arranged in the middle of the length A, the original resonance frequency $f_1$ having a wavelength $\frac{1}{4}\lambda_1=A$ is split in two resonance frequencies $f_{1a}$ and $f_{1b}$, each having a resulting wavelength $\frac{1}{4}\lambda_{1a}=\frac{1}{4}\lambda_{1b}=A/2$. In other words, the coaxial impedance member 10 moves up (increases) the resonance frequency. The coaxial impedance member 10 functions as a detuning member. By detuning the resonance frequency, the amount of energy is potentially further reduced.

If the coaxial impedance member 10 is placed anywhere to the tower 2 except for the axial center, a first one of the two resulting resonance frequencies is higher than the original resonance frequency, and a second one of the two resulting resonance frequencies is not only much higher than the original resonance frequency but also higher than the first one of the two resulting resonance frequencies.

Figure 5:
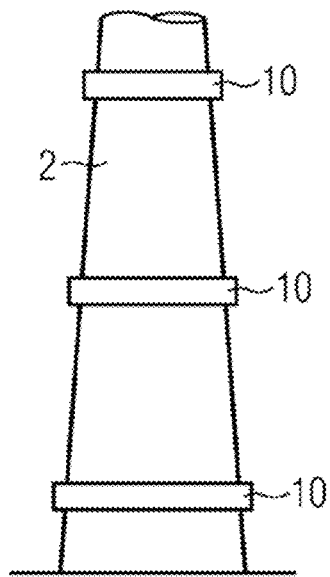
FIG. 5 shows an embodiment of a tower comprising a plurality of coaxial impedance members.

FIG. 5 shows an embodiment, where the tower 2 is provided with a plurality (three) of coaxial impedance members 10 so that the original resonance frequency is split a plurality of times (three times). In the embodiment described so far, the coaxial impedance members 10 are arranged on the tower 2. However, it is clear that a coaxial impedance member 10 can be arranged in addition or alternatively at any other element of the wind turbine 1 such as the nacelle 3 and/or one or more blades 6, for example on a circumferential surface thereof.

Figure 6:
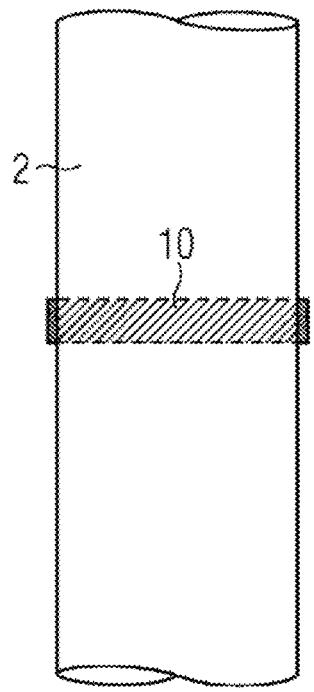
FIG. 6 shows an embodiment of a tower comprising a coaxial impedance member made of nanocrystalline material.

FIG. 6 shows that the coaxial impedance member 10 is formed of a tape of electrically conductive material and is arranged about and axially aligned with the tower 2. Due to the very low common mode current in the tower surface, only a very small amount of tape material is needed. The tape comprises an electrically conductive material which can include a nanocrystalline or ferrite material. The nanocrystalline material can be a nanocrystalline alloy. The electrically conductive material can be applied onto a substrate member such as a flexible sheet. The sheet can be made of a synthetic resin such as polyester or metal such as aluminum.

Next, a method of suppressing an electromagnetic radiation in a wind turbine 1 is described. The coaxial impedance member 10 is configured to be placed at different axial positions of the tower 2. The coaxial impedance member 10 is placed to a position, where a current distribution in the tower 2 exhibits a maximum. The maximum current distribution in the tower 2 can be found by measurements or can be determined based on empiric data. Generally, the axial position of the element means a position along a longitudinal axis of the element. The longitudinal axis of the element is normally the axis of the longest extension of the element.

If the coaxial impedance member 10 is formed of a tape, the same is wrapped or wound about the tower 2 at the determined position.

According to embodiments of the present invention, the wind turbine 1 can satisfy the requirements for radiated emissions which define limits in the frequency range down to 150 kHz. The coaxial impedance member 10 allows detuning the resonance frequency in a simple and cost effective manner. The arrangement of the coaxial impedance member 10 can readily be integrated in the manufacturing process of the tower 2 or the other elements of the wind turbine 1. It is even possible to retrofit existing wind turbines 1 by adding the coaxial impedance member 10 ex post.

Furthermore, a choking effect can be achieved, where RF-energy is converted to heat, particularly when the coaxial impedance member 10 is arranged at a location of a high or the highest current density. For radiation emissions, a relative small amount of material is needed for the coaxial impedance member 10 due to very low currents.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A wind turbine comprising: a plurality of elements including a tower, a nacelle mounted to the tower and a plurality of blades rotatable mounted to the nacelle, wherein at least one element of the tower, the nacelle, and the plurality of blades is configured to exhibit electromagnetic oscillation along an axis of the at least one element with a resonance frequency (fn) of an order n, and comprises a coaxial impedance member that is coaxially arranged about the axis of the at least one element, and is tuned to the resonance frequency of the order n.

2. The wind turbine according to according to claim 1, wherein the coaxial impedance member functions as a choke such that an electric current oscillating with the resonance frequency (fn) within the at least one element is attenuated and the energy thereof is converted to heat in the coaxial impedance members; and/or the coaxial impedance member functions as a detuning member such that the resonance frequency (fn) is split in two resulting resonance frequencies ($f_{1a}$ and $f_{1b}$) being higher than the resonance frequency (fn).

3. The wind turbine according to claim 1, wherein the coaxial impedance member is configured to be placed at different positions along the axis of the at least one element.

4. The wind turbine according to claim 1, wherein the coaxial impedance member has a length substantially equal to approximately one-quarter wavelength.

5. The wind turbine according to claim 1, wherein the coaxial impedance member is formed of a tape or a sleeve comprising electrically conductive material.

6. The wind turbine according to claim 1, wherein the electrically conductive material comprises a nanocrystalline or ferrite material.

7. A tower for a wind turbine, comprising a coaxial impedance member coaxially arranged about a longitudinal axis of the tower; wherein the tower is configured to exhibit electromagnetic oscillation along an axis of the tower with a resonance frequency (fn) of an order n, and wherein the coaxial impedance member is tuned to the resonance frequency of the order n.

8. A blade for a wind turbine, comprising a coaxial impedance member coaxially arranged about a longitudinal axis of the blade; wherein the blade is configured to exhibit electromagnetic oscillation along an axis of the blade with a resonance frequency (fn) of an order n, and wherein the coaxial impedance member is tuned to the resonance frequency of the order n.

9. A method of suppressing electromagnetic radiation having a resonance frequency (fn) of an order n in a wind turbine, the wind turbine comprising a plurality of elements including a tower, a nacelle mounted to the tower, and a plurality of blades rotatable mounted to the nacelle; wherein at least one element of the tower, the nacelle, and the plurality of blades is configured to exhibit electromagnetic oscillation along an axis of the at least one element with a resonance frequency (fn) of an order n, and the method comprising arranging a coaxial impedance member coaxially about an axis of at least one element of the towers, the nacelle and the plurality of blades; wherein the coaxial impedance member is tuned to the resonance frequency of the order n.

10. The method according to claim 9, wherein the step of arranging the coaxial impedance member comprises placing the coaxial impedance member at a position along the axis of the at least one element, where a current distribution or current density in the element exhibits a maximum.

11. The method according to claim 9, wherein arranging the coaxial impedance member comprises a step of wrapping a tape of an electrically conductive material about the at least one element.

* * * * *